| (12) | United States Patent | (10) Patent No.: | US 8,299,341 B2 |
|---|---|---|---|
| | Greer et al. | (45) Date of Patent: | Oct. 30, 2012 |

(54) FABRICATION OF VERTICALLY ALIGNED METALLIC NANOPILLARS

(75) Inventors: Julia R. Greer, Pasadena, CA (US); Michael Burek, Waterloo (CA)

(73) Assignee: The California Institute of Technology, Pasadena, CA (US)

( * ) Notice: Subject to any disclaimer, the term of this patent is extended or adjusted under 35 U.S.C. 154(b) by 76 days.

(21) Appl. No.: 12/779,780

(22) Filed: May 13, 2010

(65) Prior Publication Data

US 2010/0291385 A1 Nov. 18, 2010

Related U.S. Application Data

(60) Provisional application No. 61/177,944, filed on May 13, 2009.

(51) Int. Cl.
*H01L 21/44* (2006.01)

(52) U.S. Cl. ........ 977/712; 977/721; 977/722; 977/816; 438/479; 438/679; 438/681; 438/678; 257/E51.043

(58) Field of Classification Search .................... 602/41; 977/712, 721, 722, 816; 438/479, 679, 681, 438/678; 257/E51.043
See application file for complete search history.

(56) References Cited

U.S. PATENT DOCUMENTS

| 6,720,469 | B1 * | 4/2004 | Curtis et al. .................. 602/41 |
| 7,521,274 | B2 * | 4/2009 | Hersee et al. ................. 438/41 |
| 7,592,255 | B2 * | 9/2009 | Kuekes et al. ............... 438/679 |
| 7,818,816 | B1 * | 10/2010 | Reppert et al. ................ 850/1 |
| 7,820,064 | B2 * | 10/2010 | Jin ............................... 216/41 |
| 7,932,106 | B2 * | 4/2011 | Li ................................ 438/22 |

* cited by examiner

*Primary Examiner* — Cathy Lam

(74) *Attorney, Agent, or Firm* — Joseph R. Baker, Jr.; Gavrilovich, Dodd & Lindsey LLP

(57) ABSTRACT

Solid and hollow cylindrical nanopillars with nanoscale diameters are provided. Also provides is a method of making such nanopillars using electron beam lithography followed by the electroplating.

14 Claims, 11 Drawing Sheets

(d)

(e)

FABRICATION OF VERTICALLY ALIGNED METALLIC NANOPILLARS

CROSS REFERENCE TO RELATED APPLICATIONS

This application claims priority to U.S. Provisional Application Ser. No. 61/177,944, filed May 13, 2009, the disclosure of which is incorporated herein by reference.

STATEMENT REGARDING FEDERALLY SPONSORED RESEARCH

This invention was funded in part by Grant No. DMR-0520565 awarded by the National Science Foundation. The Government has certain rights in the invention.

TECHNICAL FIELD

This invention relates to compositions and methods for generating nanostructures.

BACKGROUND

There is an increasing demand for methods for generating nanostructures for use in numerous electrical, optical, biological, mechanical and other technological devices. Such devices include, for example, solar cells, photo-detectors, micro-electro-mechanical systems (MEMS), photonic crystals, memory devices, nano-filtration, fuel cells, and artificial kidneys. Conventional photolithography techniques cannot satisfy the small dimension requirements in many of these applications, due to the light source's wavelength limit.

SUMMARY

The disclosure provides a solid or hollow metal-based nano-crystalline structure lacking $Ga^+$ ion damage. In one embodiment, the solid or hollow nano-crystalline structure is made by a process comprising (a) coating a substrate with a conductive layer; (b) coating the conductive layer with a resist polymer; (c) using an electron beam lithography technique to pattern a template into the resist polymer; (d) electrodepositing a metal into the template; and (e) removing the resist. In yet another embodiment, the substrate comprises a material selected from the group consisting of silicon dioxide, fused-silica, quartz, silicon, organic polymers, siloxane polymers, borosilicate glass, fluorocarbon polymers, metal, hardened sapphire, and a ceramic. In a specific embodiment, the substrate is silicon. In one embodiment, the conductive layer comprises a conductive metal. In yet another embodiment, the resist polymer comprises polymethylmethacrylate. In one embodiment, the electrodepositing is by potentiostatic, galvanostatic or by alternating current/voltage techniques. In one embodiment, the metal is selected from the group consisting of gold, silver, rhodium, copper, chrome, nickel, brass, iridium and alloys of any of the foregoing. The nanostructure may further be coated with a metal oxide, nitride or other organo-metallic material.

The disclosure also provides a method of making a nanopillar or nanostructure composition comprising: (a) coating a substrate with a conductive layer; (b) coating the conductive layer with a resist polymer; (c) using an electron beam lithography technique to pattern a template into the resist polymer; (d) electrodepositing a metal into the template; and (e) removing the resist. In one embodiment, the substrate comprises a material selected from the group consisting of silicon dioxide, fused-silica, quartz, silicon, organic polymers, siloxane polymers, borosilicate glass, fluorocarbon polymers, metal, hardened sapphire and a ceramic. The substrate may be rigid or semi-rigid. In one embodiment, the substrate is silicon. In yet another embodiment, the conductive layer comprises a conductive metal. In a specific embodiment, the resist polymer comprises polymethylmethacrylate. In another embodiment, the electrodepositing is by potentiostatic, galvanostatic or by alternating current/voltage techniques. In yet another embodiment, the metal is selected from the group consisting of gold, silver, rhodium, copper, chrome, nickel, brass, iridium and alloys of any of the foregoing, other metal and alloys will be readily apparent to one of skill in the art. In another embodiment, the method further comprises coating with a metal oxide, nitride or other organo-metallic material.

DETAILED DESCRIPTION

Figure 1:
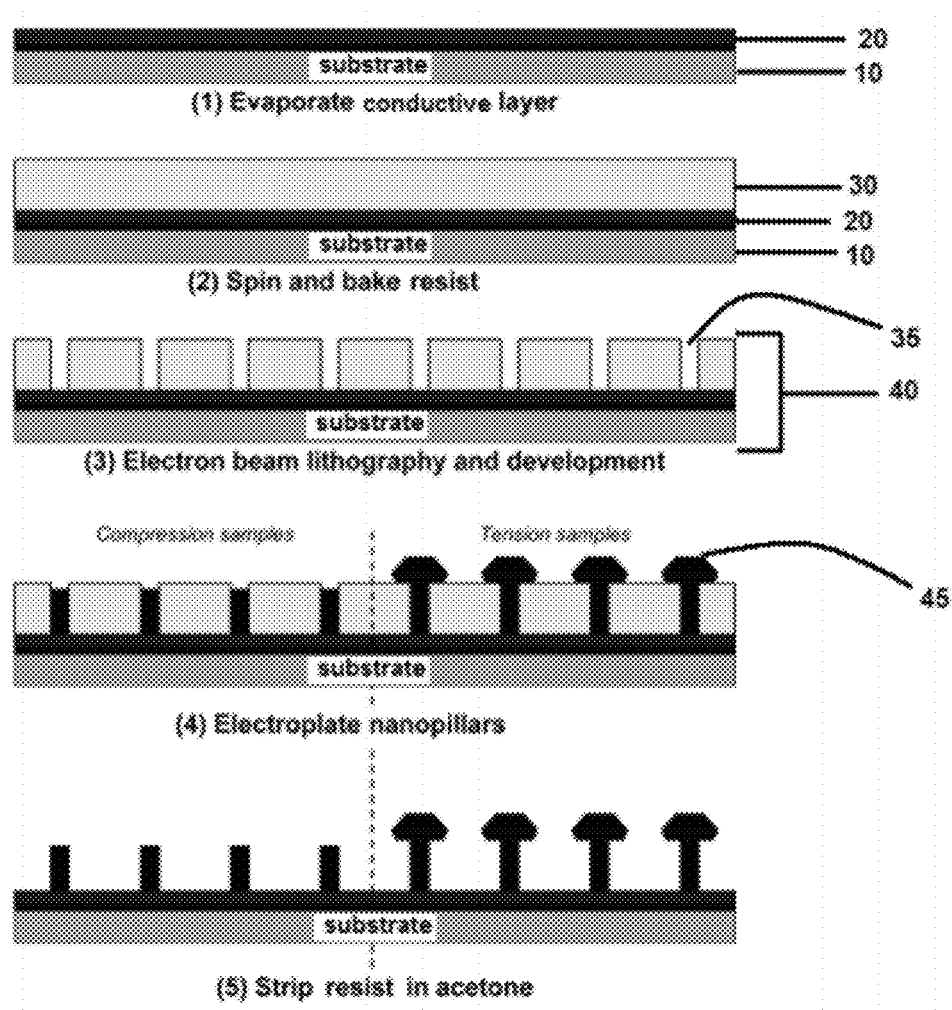
FIG. 1 shows a schematic representation of the FIB-less fabrication process of the disclosure, other materials that may be substituted will be readily apparent to one of skill in the art.

As used herein and in the appended claims, the singular forms "a," "and," and "the" include plural referents unless the context clearly dictates otherwise. Thus, for example, reference to "a pillar" includes a plurality of such pillars and reference to "the nanostructure" includes reference to one or more nanostructures known to those skilled in the art, and so forth.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of:"

By "about" is meant a quantity, level, value, number, frequency, percentage, dimension, size, amount, weight or length that varies by as much as 30, 25, 20, 25, 10, 9, 8, 7, 6, 5, 4, 3, 2 or 1% to a reference quantity, level, value, number, frequency, percentage, dimension, size, amount, weight or length.

With respect to ranges of values, the invention encompasses each intervening value between the upper and lower limits of the range to at least a tenth of the lower limit's unit, unless the context clearly indicates otherwise. Further, the invention encompasses any other stated intervening values. Moreover, the invention also encompasses ranges excluding either or both of the upper and lower limits of the range, unless specifically excluded from the stated range.

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

The publications discussed above and throughout the text are provided solely for their disclosure prior to the filing date of the present application. Nothing herein is to be construed as an admission that the inventors are not entitled to antedate such disclosure by virtue of prior disclosure.

There has been an interest in size-dependent mechanical properties of micro- and nano-structures due to the advancements in the instrumental resolution and in computational capabilities. In the case of single crystalline metals, the size effects manifest themselves as a pronounced increase in compressive strength when the external dimensions are reduced to the micrometer and submicrometer scale. To study this size-dependent material strengths, cylindrical pillars with diameters ranging from several micrometers down to several hundred nanometers have been fabricated by utilizing a focused ion beam (FIB) milling method for subsequent uniaxial compression testing. Although most research groups report a pronounced power-law relationship between the attained strength and pillar diameter, there remains contention as to the influence of Ga$^+$ induced damage on the nanopillar strength and commencing plastic deformation mechanism. Furthermore, nanopillars prepared by the top-down FIB milling process have a noticeable vertical taper, which becomes more severe as the pillar diameter is reduced, and thus results in the undesirable non-uniform strain distribution within the pillar. Further, such FIB-based fabrication has limited resolution and is quite challenging if not impossible to produce these geometries of 100 nm and below.

It has been demonstrated that the mechanical and electrical properties of materials change significantly when external dimensions are confined to the nanoscale. Currently, the dominant fabrication method for mechanical testing specimens with nanometer dimensions is by using focused ion beam (FIB) milling, which results in inevitable Ga$^+$ induced damage to the microstructure.

Figure 2:
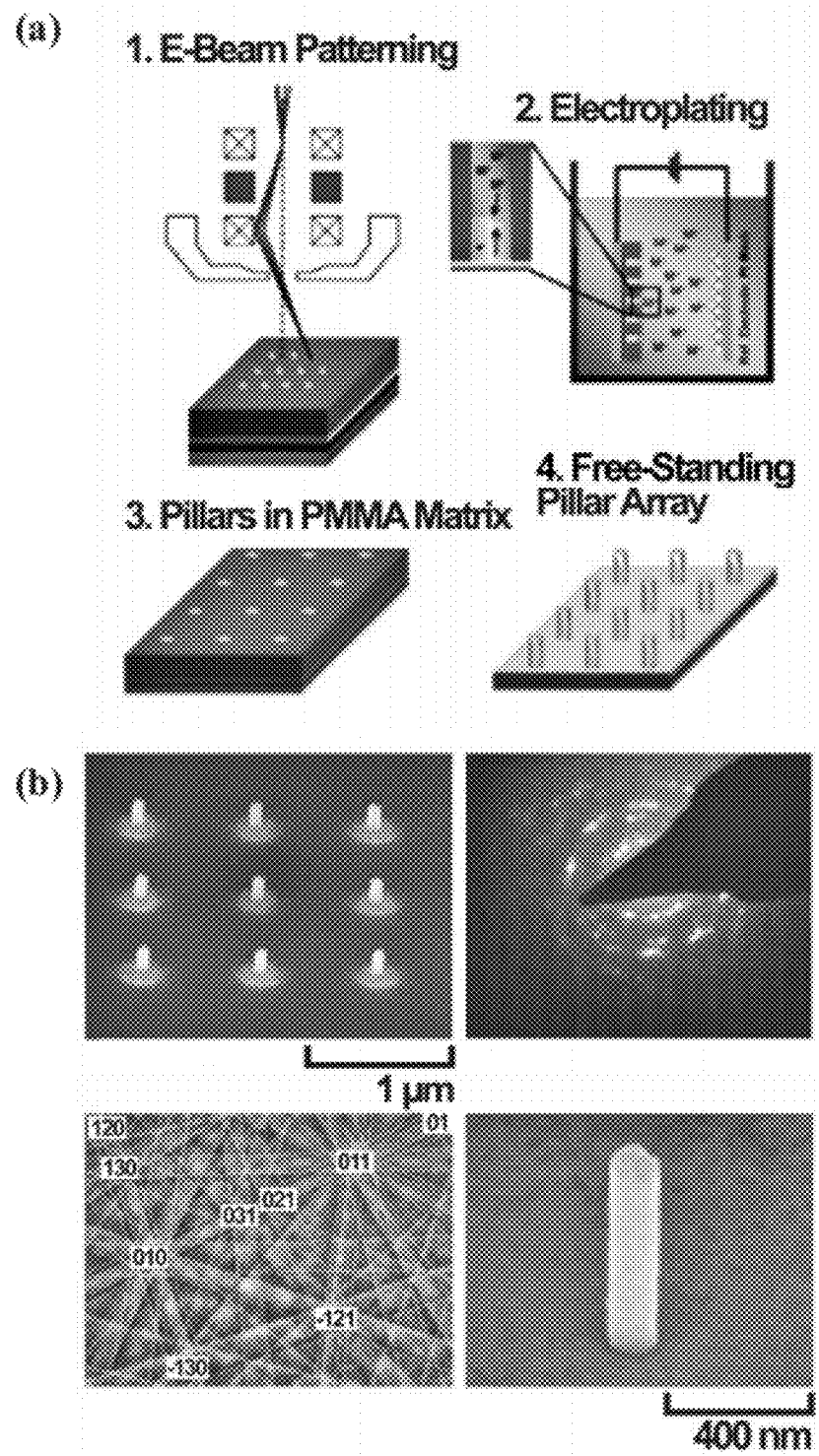
FIG. 2A-E shows another depiction of the fabrication method of the disclosure. (a) A schematic of fabrication steps for FIB-less fabrication: EBL patterning followed by electroplating. (b) A 3×3 array of gold nanopillars produced by this technique showing the Kikuchi patterns indicating its nanocrystalline microstructure. (c) Electroplated copper nanopillar with (likely) twin boundaries fabricated by EBL patterning followed by the depicted process. (d) An array of intentionally over-plated copper single-crystalline pillars for tension testing. (e) Bright-field TEM image and diffraction pattern showing the single crystalline nature and orientation of a copper nanopillar fabricated by this process.
Figure 2:
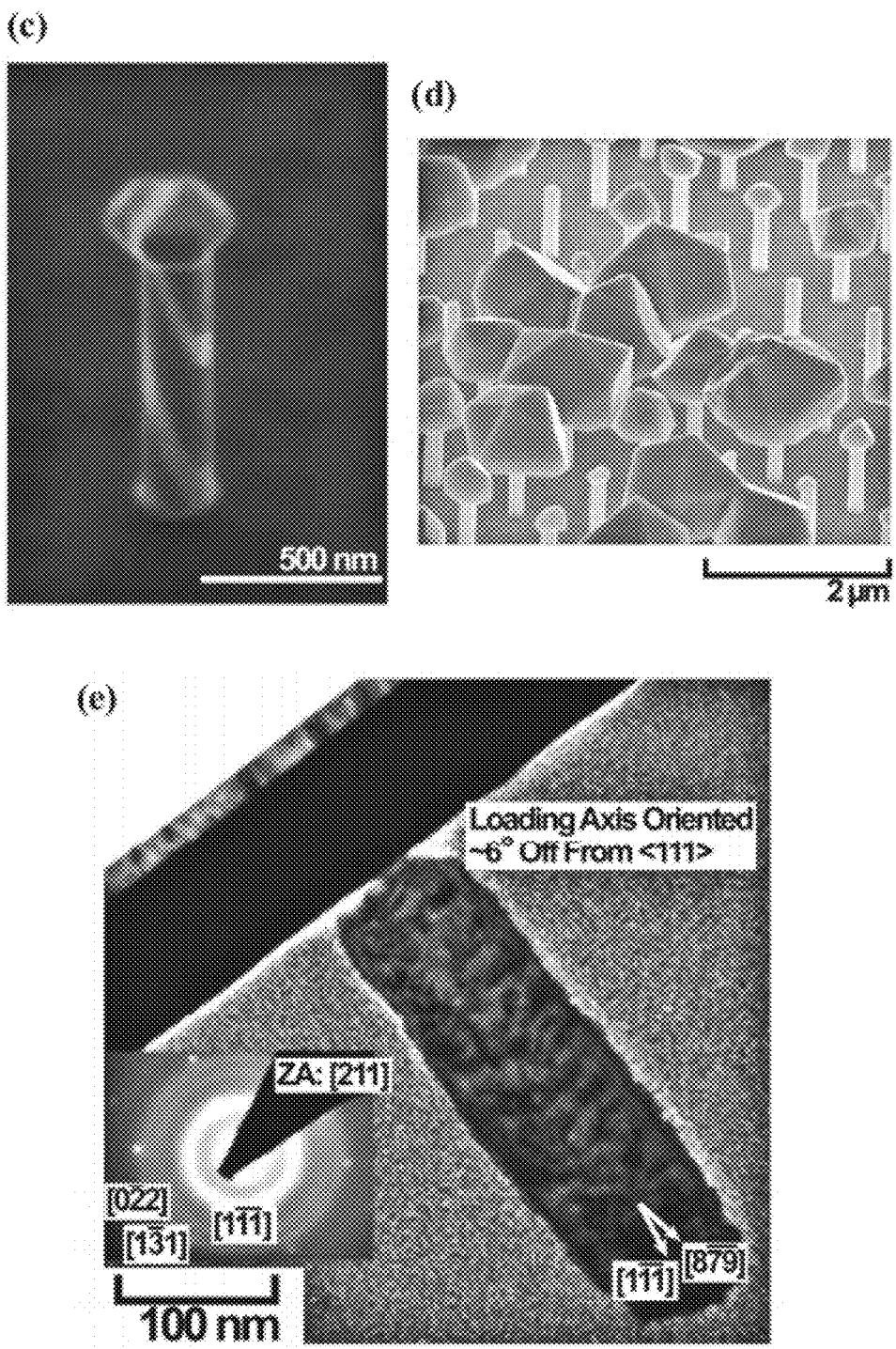

Although the FIB-based nanomachining technique is capable of successful fabrication of microcompression and tension specimens, it has three distinct disadvantages: first, the minimum realistically attainable pillar diameter is ~150 nm, second, the degree to which ion bombardment on the surface structure translates to nanopillar mechanical performance remains a point of contention, and finally, it requires a large amount of time to manufacture individual samples, which significantly reduces the throughput. Therefore, a nano-mechanical sample fabrication methodology that does not utilize the damaging ion bombardment by using electron-beam lithography (EBL), and which is capable of producing small geometric structures (e.g., circular, columnar, conical, cylindrical, cuboidal) on the order of 100 nm or less is provided. Electron-beam lithography is a top-down lithographic fabrication technique that employs a focused beam of high-energy electrons to expose a resist (e.g., a poly(methyl methacrylate) (PMMA) resist). The interaction of the electrons within the resist solubilizes the exposed regions by severing chemical bonds and, after developing the resist in a chemical bath, the desired pattern is transferred onto the underlying seed metal film to enable further processing. Various metals can then be deposited within the open pores template by EBL via electrochemical deposition where a metal ion salt solution is potentiostatically or galvanostatically reduced at the film surface, or by alternating current/voltage techniques thus plating the desired metal. FIGS. 1 and 2 show a schematic of the fabrication procedure, an array of nanocrystalline gold nanopillars, a twinned candy-cane-like microstructure of a copper nanopillar, an array of single-crystalline copper nanopillars with intentional overplates for tensile testing, and a TEM image revealing the single-crystalline microstructure and close-to-<111>crystallographic orientation.

The disclosure provides a FIB-less fabrication technique to create arrays of vertically oriented metal-based (e.g., metal and alloys thereof) nanostructures. The fabrication process is capable of producing a wide range of microstructures: from single crystals and twinned, to bi-, poly-, and nanocrystalline mechanical specimens with diameters/cross-sections from about 750 down to 25 nm with, in some embodiments, a diameter ranges below about 100 nm (e.g., about 10-100 nm) previously inaccessible by FIB. Although nanopillars are described herein as being exemplary of the techniques, other geometrics comprising conical shapes, cuboidal shapes and the like are within the scope of the disclosure.

This fabrication method also allows control over the microstructure covering the entire range from nanocrystalline to single-crystalline. Our fabrication method involves lithographic patterning of polymethylmethacrylate (PMMA) resist with electron beam lithography, followed by metal electrochemical deposition into the prescribed resist template. Fundamentally, this fabrication approach is analogous to other template-based syntheses wherein one-dimensional nanostructures are fabricated by electroplating into the pores of either polycarbonate or alumina membranes. The method overcomes previous limits on the control over pore size and placement in conventional porous membranes. To combat this limitation, a lithographic method for template fabrication that allows full and independent control over pore size and spacing is used. The disclosure provides a nondamaging technique to create isolated metal nanopillars with sub-100 nm diameters and with nonzero initial dislocation densities, that is, dissimilar to nanowhiskers. Also provided is a novel sacrificial metal masking sample preparation method for transmission electron microscopy (TEM) analysis of these nanopillars.

Referring to FIG. 1 a general fabrication technique of the disclosure is depicted. The fabrication process begins with a rigid or semi-rigid substrate (10), upon which a conductive layer (20) is deposited using, for example, standard thin film deposition techniques (e.g., sputtering, evaporation, CVD and the like). The substrate (10) can be any rigid material such as, for example, silicon dioxide, fused-silica, quartz, silicon, organic polymers, siloxane polymers, borosilicate glass, fluorocarbon polymers, metal, hardened sapphire, and the like, or any combination thereof. The material for use as the conductive layer (20) can be any metal or conductive material of an appropriate thickness for electrochemical processing (e.g., does not form a strong passivation layer such as an oxide or which ma comprise an oxide so long as the oxide is etched away before electroplating). For example, the conductive layer may be a metal, a metal-alloy, a polymer or other material (e.g., indium tin oxide). The substrate (10) comprising the conductive layer (20) is then coated (e.g., by spin coating) with a polymer resist (30) that is sensitive to electron beam exposure. A number of such polymers are known in the art. In one embodiment, the polymer comprises polymethylmethacrylate (PMMA). The particular types of PMMA (e.g., molecular weight, dilution and solvent) are not critical and can be determined using standard skill in the art.

After spin coating and curing, the resist (30) is exposed to a high energy electron beam to pattern (35) the template. The exposure patterns are generated via a tool-appropriate software, allowing for precise isolation and simultaneous fabrication of indicator markers. The resolution of electron beam lithography is primarily a function of the electron dosage, whose optimal value depends on the resist type and thickness, minimum feature size, and pattern density. Since these relations are inherently nonlinear, a dose matrix was routinely used in order to empirically determine the optimal exposure conditions. After electron beam exposure, the resist is developed to reveal the cathode surface in the exposed region.

Following the resist development, the template (40) is ready for metal electrodeposition. Electrical connection is made to the metal layer underneath the resist template; it is then lowered into a plating solution with an appropriate reference electrode. A large variety of metal plating solutions are available for use with this process granted the chose electron beam resist is chemically compatible. For example, the electroplating can comprise metals such as lead, tin, bismuth, indium, alloys thereof (e.g., with Cu and Au), semiconductive compounds and oxides (e.g., CdS, CdSe, CdTe, ZnS, ZnSe, ZnTe, $Bi_2Te_3$, ZnO and the like). The electroplating is then carried out either potentiostatically or galvanostatically or by alternating current/voltage techniques to fill the nanopillar resist template with a desired fill material (45). The plating time is adjusted in order to obtain the desired nanopillar height. It is important to note that there is no restriction on the number of metals which may be plated in the pores from a variety of plating solutions. For example, plating solutions and appropriate metal can include gold, silver, rhodium, copper, chrome, nickel, brass, alloys of any of the foregoing, and the like. As such various metallic heterojunctions may be fabricated within a single nanopillar. For nanopillars intended for tension samples, the plating time is chosen such that there is an appropriate level of overplated metal which may be accessed by microgrips. After metal electroplating the resist is stripped and the nanopillars are free for testing.

Through the use of electroplating, the final microstructure of the nanopillars can be fine-tuned over a large range of microstructures: nanocrystalline, polycrystalline, bi-crystalline, single crystalline and nanotwinned (even in the case of multi-metallic structures). This is a result of the large number of influential parameters during the plating process. These parameters include, but are not limited to (1) type and nature of the plating solution, (2) addition of organic additives; (3) applied potentiostatic or galvanostatic waveform; and (4) plating solution temperature.

Figure 3:
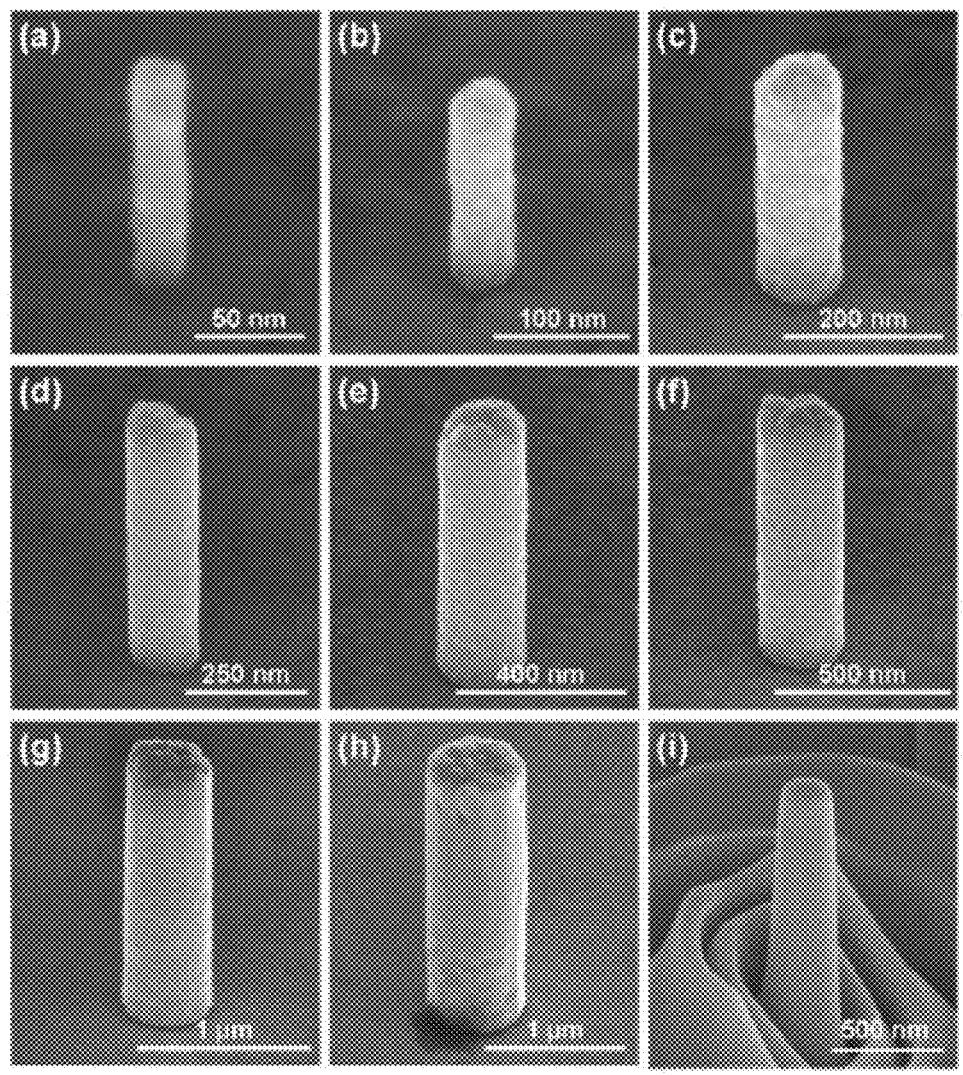
FIG. 3A-I shows SEM images of Au nanopillars prepared for compression tests with diameters of 25, 50, 100, 150, 200, 250, 500, and 750 nm. All nanopillars were fabricated with an aspect ratio of ~1:4 with the exception of the 25 nm diameter pillar that has an aspect ratio of ~1:8. A SEM image of a gold pillar with a nominal diameter of ~300 nm prepared by FIB milling is shown in (i). A clear reduction in pillar tapering is observed between samples prepared by the FIB milling and FIB-less fabrication methods. All images were taken at a 52° stage tilt.

To gauge the microstructure of nanopillars, transmission electron microscopy (HRTEM) and electron diffraction analysis is required. Preparing site-specific nanopillar samples for HRTEM also involves a non-trivial procedure, and this process is further disclosed here. FIG. 3 for example, shows the preparation steps for HRTEM samples. Electroplated nanopillars are removed from the resist template and then coated by a metal, oxide, or nitride or any organometallic substance using any number of different deposition techniques (e.g., sputter deposition), which subsequently serves as a sacrificial masking layer. The thickness of the masking layer is maintained at about 50% to 100% of the nanopillar height. HRTEM samples are then prepared in the FIB by milling, e.g., by milling two 30 um long by 5 um wide by 5 um deep trenches above and below the pillar, leaving it on a thin lamella underneath. This lamella is then limited out of the sample and attached to a TEM grid via Omniprobe (Omniprope, Inc.) After the lamella has securely adhered to the TEM grid, the masking layer is etched away using any appropriate non-destructive etch techniques known in the art (e.g., by using an appropriate wet etch), which is selective to the metal nanostructure (e.g., nanopillar) underneath. The etching step leaves pillars ready for HRTEM imaging and free of any ion damage and redeposition.

The methods of the disclosure provides several major advantages over the conventional FIB milling of nanopillars and tensile samples. First, by replacing FIB fabrication with a procedure that does not utilize ion bombardment, the metallic nanopillar crystalline structure is absent of $Ga^+$ ion damage. Second, by using electron beam lithography, pillars with diameters much smaller than those possible with the FIB technique can be readily fabricated. Third, when optimized this fabrication method greatly reduces pillar tapering relative to FIB fabrication and virtually eliminates the presence of any appreciable strain-gradients in the deformation process. Finally, the FIB fabrication process is inherently slow and significantly limits the sample throughput time. The proposed fabrication method has a much higher throughput with hundreds of pillars in any arraying configuration desirable fabricated simultaneously on the same substrate.

The following examples are meant to illustrate, not limit, the disclosed invention.

EXAMPLES

Au and Cu nanopillars were intentionally chosen to demonstrate the feasibility of the process; however the technique is not limited to these particular metals and can be applied to a wide variety of electroplatable systems. Nanopillar arrays were fabricated on Si substrates ranging in size from ~1 cm² chips to 100 mm diameter wafers. Prior to applying the PMMA resist, a 20 nm thick Ti adhesion layer and a 100 nm thick Au seed layer were deposited on the substrate by electron beam evaporation. This conductive seed layer acts as a cathode in the subsequent electroplating steps. The choice of metal and the thickness of this conductive layer are noncritical, but need to be appropriate for the electrochemical processing, that is, the film does not form an oxide, and for the nanomechanical testing, that is, strong adhesion between the film and the Si substrate. The substrates were spin coated with various dilutions of about 950 kD PMMA in anisole (Micro-Chem. Corp.). Table 1 outlines the PMMA resist conditions used to generate the specific range of desired pillar diameters. Generally, pillars meant for compression testing have an aspect ratio of at least about 1:3 (height/diameter) and no greater than about 1:6. This ensures that nanopillars are tall enough to experience homogeneous deformation without significant effects of top and bottom constraints, but not so tall as to buckle during compression testing. An aspect ratio of ~1:4 was selected as the standard for the nanopillars fabricated here. Even though the nanopillar aspect ratio is ultimately governed by plating time, the PMMA resist thickness should closely matches the intended nanopillar height. For the specific embodiment in this example, this requirement is important for the fabrication of taper-free pillars with sub-100 nm diameters and also eliminates the use of excessive electron doses. The resist dilutions were selected such that the spin conditions were maintained between about 1500 and 4500 rpm, thus ensuring uniform PMMA films. Following spin coating, the PMMA layer was baked at about 180° C. for 15 min. The resist was then exposed using a Leica EBPG5000+ electron beam lithography system operating at an acceleration voltage of 100 kV. For all exposures, the beam current was maintained between about 650 and 800 pA and the beam step size was bout 5 nm. The resolution of electron beam lithography is primarily a function of the electron dosage, whose optimal value depends on the resist type and thickness, minimum feature size, and pattern density. Since these relations are inherently nonlinear, a dose matrix was routinely used in order to empirically determine the optimal exposure conditions. Table 1 also provides the electron doses for the corresponding PMMA resist parameters (for the particular instrument and system). Exposure patterns were computer generated and are extremely flexible, allowing for precise isolation of nanopillars and simultaneous fabrication of the indicator markers, as the individual nanopillars were routinely spaced up to 50 μm apart. Following exposure, the PMMA was developed for 60 s in a 1:3 solution of methyl-isobutylketone (MIBK) and isopropyl alcohol (IPA) followed by a 5 s rinse in IPA.

TABLE 1

Polymethylmethacrylate (PMMA) Resist and Electron Beam Exposure Parameters for Nanopillar Samples of Various Diameters Intended for Compression Testing[a]

| pillar dimensions | | resist parameters | | exposure parameters |
|---|---|---|---|---|
| d (nm) | L (nm) | dilution (%) | speed (rpm) | dose (μC/cm²) |
| 25 | 100 | 4 | 2500 | 2600 |
| 50 | 200 | 4 | 2500 | 1600 |
| 100 | 400 | 7 | 3000 | 1450 |
| 150 | 600 | 7 | 1500 | 1600 |
| 200 | 800 | 9 | 4500 | 1550 |
| 250 | 1000 | 9 | 2000 | 1500 |
| 500 | 2000 | 11 | 2500 | 1600 |
| 750 | 3000 | 11 | 1500 | 1750 |

[a]The resist type is 950 kD PMMA diluted in anisole (MicroChem Corp.). The electron doses were observed for a pattern density of $1.0 \times 10^6$ cm$^{-2}$.

Following development of the PMMA, the resist template was ready for metal electroplating. Electroplating was performed using a two electrode configuration in a 1.0 L glass beaker. The Au seed layer underneath the resist template acted as the cathode, and a Pt-coated Ti mesh was used as an insoluble anode. The Au plating solution used was a commercially available, ready to use $[Au(SO_2)_2]^2$ plating bath (Technic Gold 25-ES, Technic, Inc.). The Cu plating solution was made using 125 g/L $Cu(SO_4).5H_2O$ and a supporting electrolyte of 50 g/L $H_2SO_4$. The homemade Cu plating solution was mixed with deionized water and reagent grade chemicals. The bath temperature was maintained at 60° C. in the case of Au deposition and at room temperature for Cu deposition. The plating solution was mechanically stirred and electroplating was performed under both galvanostatic (DC) and reverse pulse (AC) conditions. In DC plating, the current densities were varied between about 2.5 to 10 mA/cm² for Au electroplating and between 10 to 35 mA/cm² for Cu electroplating. For AC plating, the cathodic/anodic current ratio was varied between 5:1 and 1:1, and in all cases the cathodic pulse was held for 5 s followed by the anodic pulse for 1 s. The electroplating rate was estimated using Faraday's law, and deposition was stopped when the desired pillar height was achieved. Occasionally, fresh electrolytes were used, but in most cases the solutions were preconditioned electrolytes reused from earlier experiments. Following metal deposition, the PMMA resist was stripped in a bath of acetone at room temperature and rinsed in acetone and IPA. In the case of pillars to be used for tension tests, metal was intentionally overplated for a brief period to form a cap on the top of the pillar. Following removal of the resist template, these caps remain and can be accessed by a set of microgrips in order to tense the pillar.

The nanopillars were characterized by scanning electron microscopy (SEM), FIB imaging, and transmission electron microscopy and small-area electron diffraction (TEM and SAED, FEI Tecnai F20). SEM provided immediate confirmation of nanopillar geometry to validate the lithographic parameters, while FIB imaging was employed as a primarily qualitative judgment of nanopillar microstructure. FIB imaging is capable of revealing grain and twin boundary contrast, thus providing rapid feedback to adjust electroplating parameters to achieve the desired pillar microstructure. Specifically, FIB imaging was extremely useful for determining the electroplating parameters that yielded single-crystal microstructures in copper nanopillars. All FIB images were generated with a 30 kV Ga+ beam with a current of ~50 pA. As an inherently destructive method, FIB imaging is not available as a technique prior to nanomechanical testing. However, the speed of this technique allowed for imaging hundreds of pillars in order to infer the percentage of pillars with acceptable microstructures given a specific set of electroplating parameters. Because of the resolution limitations and the destructive nature of the technique, FIB imaging was limited to pillars with a minimum grain size of ~50 nm (for Cu) and minimum pillar diameter of ~200 nm.

To validate the nanopillar microstructure, TEM and SAED were utilized on a select number of representative pillars. Two sample preparation schemes were used to generate samples for TEM and SAED analysis. The first sample preparation scheme was via the "conventional" lamella lift out and its subsequent placement onto a Cu TEM grid with a micromanipulator (AutoProbe 200, Omniprobe, Inc.). Following removal of the PMMA, nanopillars intended for TEM analysis were identified by SEM in an SEM/FIB dual beam system (Nova NanoLab 600, FEI Company) and then coated in a several micrometer thick layer of Pt by local chemical vapor deposition (CVD) via gas injection system. The Pt is deposited through the decomposition of a Pt-based organometallic compound using the localized raster of either the electron or ion beam. As a result however, the final Pt is not pure and contains a significant fraction of carbon. Coating the pillars in Pt is necessary to protect against the redeposition and ion damage during the lift out process. Following Pt deposition, a 30 µm long by 5 µm wide by 5 µm deep lamella was milled around the pillar in order to isolate it. The lamella was then lifted out via micromanipulator and attached with Pt to a standard four post Cu TEM lift out grid. The Pt coating was then carefully thinned from both sides using a 30 kV ion beam operating at ~10 pA current to a final thickness of ~100 nm, after which the pillar was ready for TEM analysis.

This method is relatively quick with a high yield, and is most appropriate for larger pillars, which are not electron transparent. However, the final FIB thinning step significantly limits application of this method. First, FIB thinning (especially at high acceleration voltages) creates irreversible damage to the sample and has also been known to induce recrystallization of fine grain morphologies. This obscures the results of microstructural analysis such as high resolution imaging, dislocation density determination, and grain size. As such, this technique does not satisfy the major requirements of the nanomechanical community. Since the nanopillar fabrication method is capable of producing pillar diameters, much smaller than the electron transparent limit for most metals, a second sample preparation technique, which does not involve FIB thinning, was developed.

The second sample preparation scheme was a novel sacrificial metal masking method whereby following PMMA removal the entire pillar array was coated in ~500 nm of Cr via sputter deposition. The Cr layer served as the sacrificial masking layer. Nanopillars intended for TEM analysis were again identified via SEM and then isolated by FIB by milling 30 µm long by 5 µm wide by 5 µm deep lamella. This was followed by lift out and placement on to a Cu TEM grid via micromanipulator. With a thick Cr barrier, any exposure of the ion beam to the chromium-coated pillars during the milling and lift out process was not able to reach the pillars. However, re-deposition of milled material on the Cr-coated pillars was inevitable, hence the need for a masking layer. Following attachment of the lamella to the TEM foil, the Cr layer was etched away using a selective Cr etchant (3.0% $KMnO_4$+0.5% $NaOH+H_2O$, CR-100 recipe by Cyantek, Inc.). In most cases, the sodium hydroxide concentration in the commercial etchant recipe was increased to improve the etch speed. This etching step left pillars ready for TEM and SAED analysis and free of any ion damage and redeposition. A major advantage offered by this method is that it enables nanomechanical testing of the nanopillars directly on the TEM grid. As such, it is possible to investigate the evolution of deformation in the same pillar by doing, for example, in situ TEM analysis or ex situ imaging before and after compression. Despite the advantage of this sample preparation scheme, the entire process is inherently slow with a low yield. As such, more work is currently being done to improve the throughput of this technique.

FIG. 3a-h shows representative images of Au nanopillars prepared for compression tests electroplated at 3.5 $mA/cm^2$. The FIB-less process has clear advantage over the conventional FIB fabrication with respect to lower limit of sample size and nanopillar tapering. As a point of comparison, FIG. 2i shows a Au nanopillar with diameter of ~300 nm prepared by conventional FIB milling methodology, clearly demonstrating a more pronounced taper compared with pillars produced by the FIB-less technique. The electron beam lithography process was well optimized and nanopillars with 25 nm diameters were readily achieved. Not only is the FIB-less process absent of any $Ga^+$-induced damage, but nanopillar tapering is virtually nonexistent and the samples are even closer to being strain-gradient free during testing. Nanopillars fabricated with under or over exposed PMMA resist suffered from significant nanopillar tapering (results not shown). In larger diameter pillars, under exposing the resist resulted in a negative taper angle and mechanically unstable pillars, while in smaller diameter pillars under exposure resulted in missing pillars. For all pillar sizes, over exposure either led to nanopillars with larger than intended diameters and, in the case of significant over exposure, led to a positive taper.

In general, the resist conditions reported in Table 1 would be adequate for tension testing since the final aspect ratio of the nanopillars at the point of exiting the resist is at least ~1:6. Table 1 does not include specific resist conditions for tension nanopillars since preparing these nanopillars is largely dependent on the geometry of microgrips, which will tense the pillar. In the past, a limited number of groups have reported tension tests on pillars fabricated by FIB milling. This is because in situ mechanical testing is necessary to properly align the sample with the microgrips. Microgrippers for in situ tension testing are fabricated by FIB machining a standard diamond nanoindenter tip (i.e., Berkovich, flat-punch or cube-corner) in to the desired geometry. Practical use of microgrippers makes it a challenge to prepare nanopillar tension samples with diameters less than ~200 nm. These challenges arise from the large aspect ratios necessary, as well as the minimum size of overplate region. For smaller diameter pillars, the resist conditions would have to be altered to extend the gauge length to match that of the microgrips. It was observed that an upper limit exists for the height of smaller diameter nanopillars. For pillars between 75 and 100 nm in diameter, the limit was ~1.2 µm of resist, and for pillars less than 75 nm in diameter the limit was ~750 nm of resist. Beyond these limits, only tapered pillars or pillars with larger than intended diameters were possible to fabricate.

There was no observed limit to the spacing between pillars, although practicality limited this value to roughly 50 µm. It is important to note that the optimal dose value changed significantly when the pillar spacing was increased. Although in most situations clear indicators were fabricated simultaneously with the nanopillars, it was observed that large local indicators had a significant effect on the electroplating for certain conditions. In these instances, only homogeneous pillar arrays were fabricated prior to electroplating, and indicators were reserved for post processing.

Au electroplating was used as a standard to confirm all lithography conditions. This was because the commercial plating solution chemistry, which included extra proprietary additives, was designed for bright finish and high efficiency electroplating. As such, Au electroplating matched closely with calculations made with Faraday's law and was consistent among most plating conditions and all pore sizes. However, as a consequence of the solution chemistry, the microstructure of the Au nanopillars was limited to nanocrystalline, where only relatively small changes in grain size were possible. This was also true with the application of reversed pulse plating. The main reason for limited microstructure control in Au electroplating is the Au sulfite ($[Au-(SO_3)_2]^{3-}$) metal salt constituent of the electrolyte, and the polycrystalline nature of the nanopillars is consistent with the previous reported results. It is primarily a factor of the relative instability of the Au sulfite salt in solution, which yields liberated $Au^+$ and $SO_3^{2-}$ ions in solution. The $Au^+$ ions are believed to undergo a disproportionate reaction, $2Au^+ \rightarrow Au(0)+Au^{3+}$, yielding a precipitate of metallic Au clusters, which are subsequently absorbed on the growing cathode surface and form a polycrystalline nanopillar structure. Another important factor limiting the Au microstructure to nanocrystalline is the inclusion of proprietary plating additives in the commercial solution. Larger grain and single crystal Au plating has been reported in other works by changing the metal salt to Au cyanide ($[Au(CN)_2]^-$) and removing all additives from the solution. A similar approach was briefly explored, however initial results showed a chemical incompatibility between the Au cyanide and PMMA. To extend the range of possible microstructures, Cu electroplating was used. The choice to work with Cu stems from the simplistic and inexpensive chemistry available for Cu electroplating. The raw materials to mix the Cu plating solution were readily available, and no extra additives beyond the metal salt and acidic electrolyte were used. With the simple Cu electroplating solution, a much wider range of microstructures were available.

Figure 4:
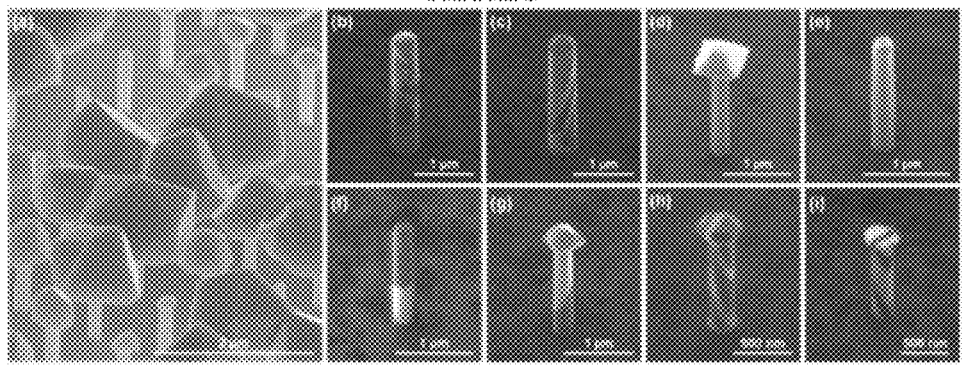
FIG. 4A-I show SEM images of an array of overplated copper nanopillars (electroplated at 15 $mA/cm^2$ DC), a diameter of ~175 nm and a gauge length of ~1 μm is shown in (a). FIB images showing grain contrast in 500 nm diameter polycrystalline copper pillars electroplated at 25 $mA/cm^2$ are shown in (b,c). FIB images of single crystal and bicrystal 250 nm diameter copper pillars electroplated with a 5 s 15 $mA/cm^2$ forward pulse and 1 s 5 mA/cm2 reverse pulse are shown in (d,e) and (f,g), respectively. FIB images of 200 nm diameter copper nanopillars electroplated at 15 $mA/cm^2$ DC showing a unique highly ordered grain structure (most likely nanotwinned) are shown in (h,i). All images were taken at a 52° stage tilt.

FIG. 4 shows examples of microstructure control available with Cu electroplating. FIG. 4a is an SEM image of 175 nm diameter Cu pillars that have been electroplated at 15 mA/cm$^2$ DC with the plating time purposely increased such as to over plate. These pillars are available for tension testing and have a gauge length of ~1 μm. The faceted nature of the over plates is indicative of large grain deposition. FIG. 4 panels b-g are FIB images of Cu pillars plated with various applied currents, both DC and AC. It was observed that current densities above roughly 20 mA/cm$^2$ DC yield polycrystalline pillars as confirmed by FIB images (FIG. 4b,c). It has been shown previously that the grain size scales inversely with the plating overpotential. As such, forward current was systematically reduced to yield large grain and single crystal pillars. The lower limit of DC current density was observed to be 10 mA/cm$^2$ at which the plating was still successful but with low efficiency. Below 10 mA/cm$^2$, Cu electroplating was mostly unsuccessful as the supplied current was most likely being used up by the reduction of $Cu^{2+}$ to $Cu^{1+}$ and other side reactions but not in the actual reduction to metallic Cu. At low current densities, FIB images showed a low yield of single crystal pillars (<5% in 250 nm diameter pillars) and a high yield of grains on the order of ~100 nm in size. It is believed that DC plating at these low current densities could yield a higher percentage of single crystal pillars in smaller diameter pillars; however this was not further investigated. One important observation to note is that FIB images routinely showed pillars with faceted overplates are not necessarily single crystal and can contain several grains throughout the pillar height before converging into one large grain that then exits the pore.

To further increase the grain size, the plating was conducted with a reverse pulse current (AC) technique. Reverse pulse plating has two advantages over DC plating in terms of large grain microstructure control. During electroplating, as a reduction potential is applied ions adjacent to the cathode are depleted and a negatively charged layer is formed. When using DC, this layer charges to a finite thickness referred to as the depletion region. This depletion region obstructs the ions from reaching the cathode, making the process diffusion limited. By incorporating reverse pulse electroplating, the reduction potential is periodically turned off, allowing the ions to partially discharge the depletion region, thus lowering the necessary overpotential and increasing the resulting grain size. Also, with AC electroplating, the plating current is temporarily reversed, which introduces a stripping time into the plating cycle. As such, reverse pulse plating selectively dissolves protrusions, defects, or any absorbed impurities off the metal surface, ensuring a more uniform deposition. FIB images of single crystal and bicrystal 250 nm diameter Cu pillars electroplated with a 5 s 15 mA/cm$^2$ forward pulse and 1 s 5 mA/cm$^2$ reverse pulse are shown in FIGS. 4d,e and f,g, respectively. With AC plating, the percentage of single crystal Cu nanopillars increased significantly. For 500 nm diameter Cu pillars electroplated with a 10 mA/cm$^2$ forward pulse and 3.5 mA/cm$^2$ reverse pulse, this ratio was calculated to be ~60%, with over 250 pillars sampled by FIB imaging. Also observed in samples which were plated with AC conditions were bi- and tri-crystals. One important observation made regarding AC plating is that the reversed pulse segment complicates the fabrication process with respect to future nanomechanical testing. Since the reverse pulse also acts as an electrochemical etch, if the deposition and etch rates are too close the resulting nanopillar often has voids and is inhomogeneous. It was also observed that reverse pulse plating conditions leading to single crystal pillars would also yield pillars which had small voids immediately at the pillar-substrate interface. These voids are believed to appear due to more defects occurring during initial plating before the metal has a chance to fill the pore. As a result of these types of voids, those pillars are not suitable for nanomechanical testing but may be desirable for other uses. FIG. 3h,i shows FIB images of 200 nm diameter Cu nanopillars electroplated at 15 mA/cm$^2$ DC showing a unique highly ordered grain structure (most likely nanotwinned). Nanopillars with this type of microstructure were not purposely formed but provide evidence that controlling the formation of highly ordered grain boundaries or twin boundaries in Cu pillars in the future may be possible.

Figure 5:
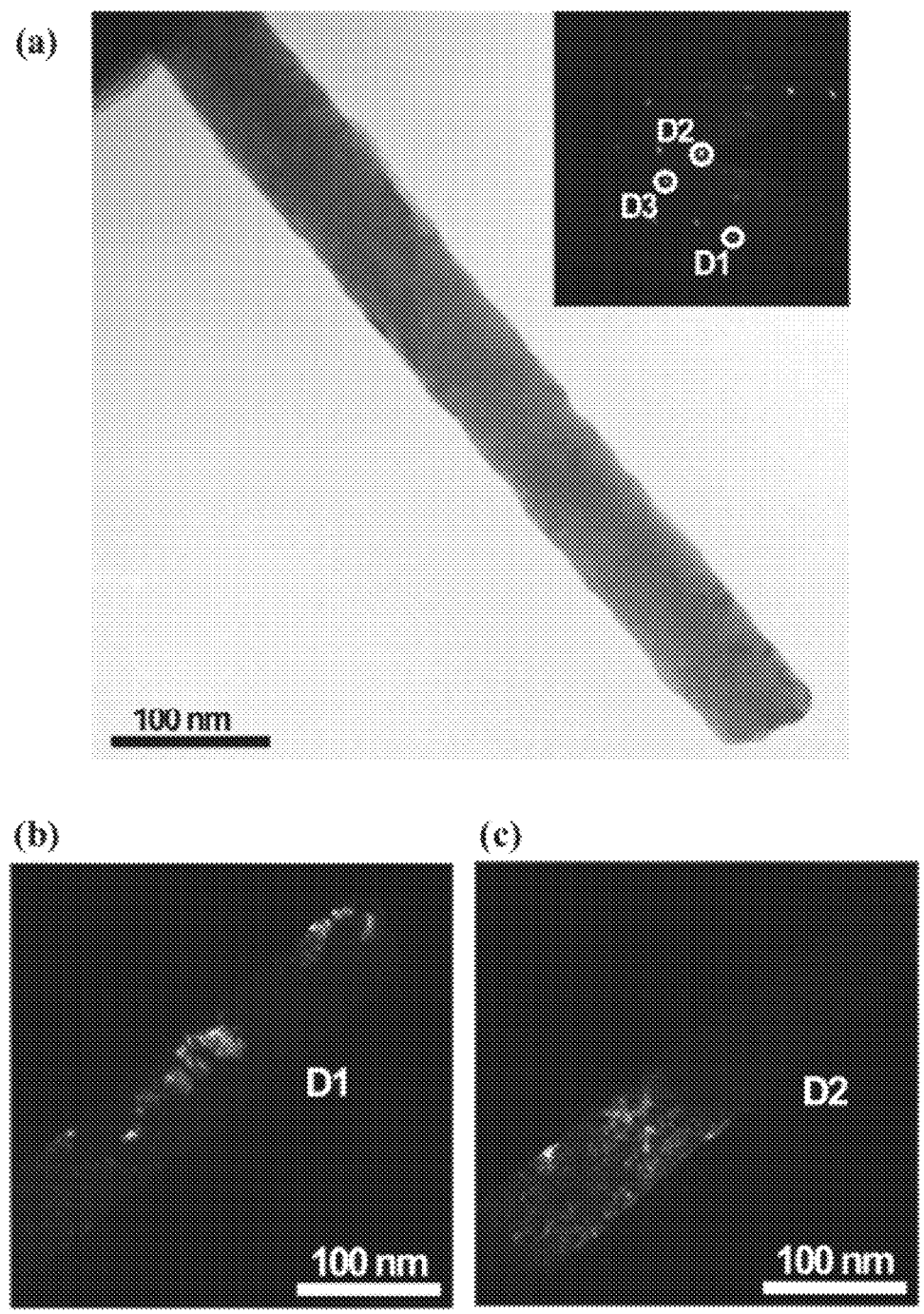
FIG. 5A-E shows bright field TEM images of an ~50 nm diameter nanocrystalline Au nanopillar electroplated at 3.5 $mA/cm^2$ DC is shown in (a) with small area electron diffraction pattern taken from the entire pillar displayed in the inset. The sample was prepared using the sacrificial Cr masking method. Corresponding dark field TEM images highlighting specific grains are shown in (b-d). The electron diffraction spots used to highlight specific grains are indicated. High-resolution TEM image of grain boundaries located at the top left corner of the nanopillar are shown in (e).
Figure 5:
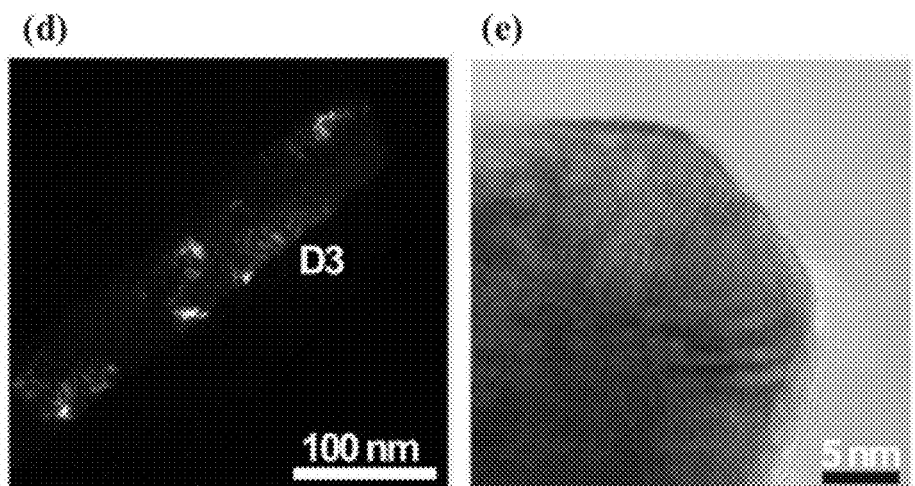
Figure 6:
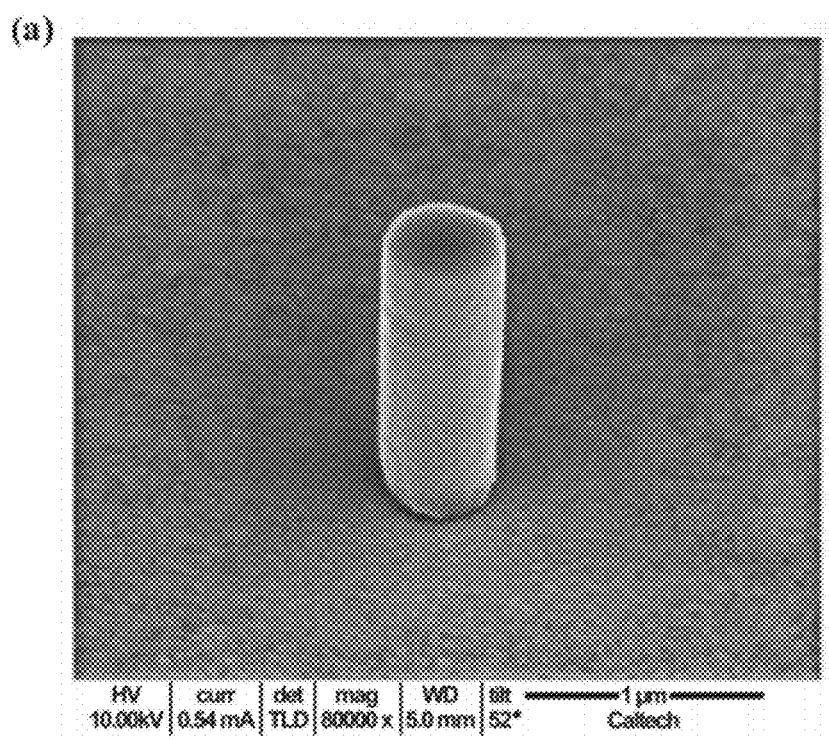
FIG. 6A-K shows a series of images demonstrating the conventional lamella lift out and FIB thinning process for preparation of TEM samples is shown in (a-f). The electroplated pillar (a) is first coated in an ~1 μm protective layer of Pt by local chemical vapor deposition (CVD) via gas injection system (b). An ~30 μm long by 5 μm wide by 5 μm deep lamella (c) is then milled around the pillar in order to isolate it. The lamella is then lifted out via micromanipulator (d) and attached with Pt to a standard Cu TEM lift out grid (e). The micromanipulator is then detached from the lamella (e) and the Pt is thinned on both sides to reveal the pillar (f). A bright field TEM image of an ~250 nm diameter singe crystal Cu nanopillar prepared by the conventional lamella lift out technique is shown in (g). The Cu pillar was electroplated using AC with a 10 mA/cm$^2$ forward and a 5 mA/cm$^2$ reverse pulse in a 5 s:1 s ratio. Small area electron diffraction patterns taken from the top and bottom halves of the pillar are shown in (h) and (i), respectively. These diffraction patterns indicate the nanopillar is a single crystal except for immediately adjacent to the Au seed layer. Corresponding dark field TEM images highlighting specific grains are shown in (j,k). The electron diffraction spots used to generate the dark field TEM images are indicated. The nanopillar axis was determined to be [7 7 10], ~10° off of [1 1 1].
Figure 6:
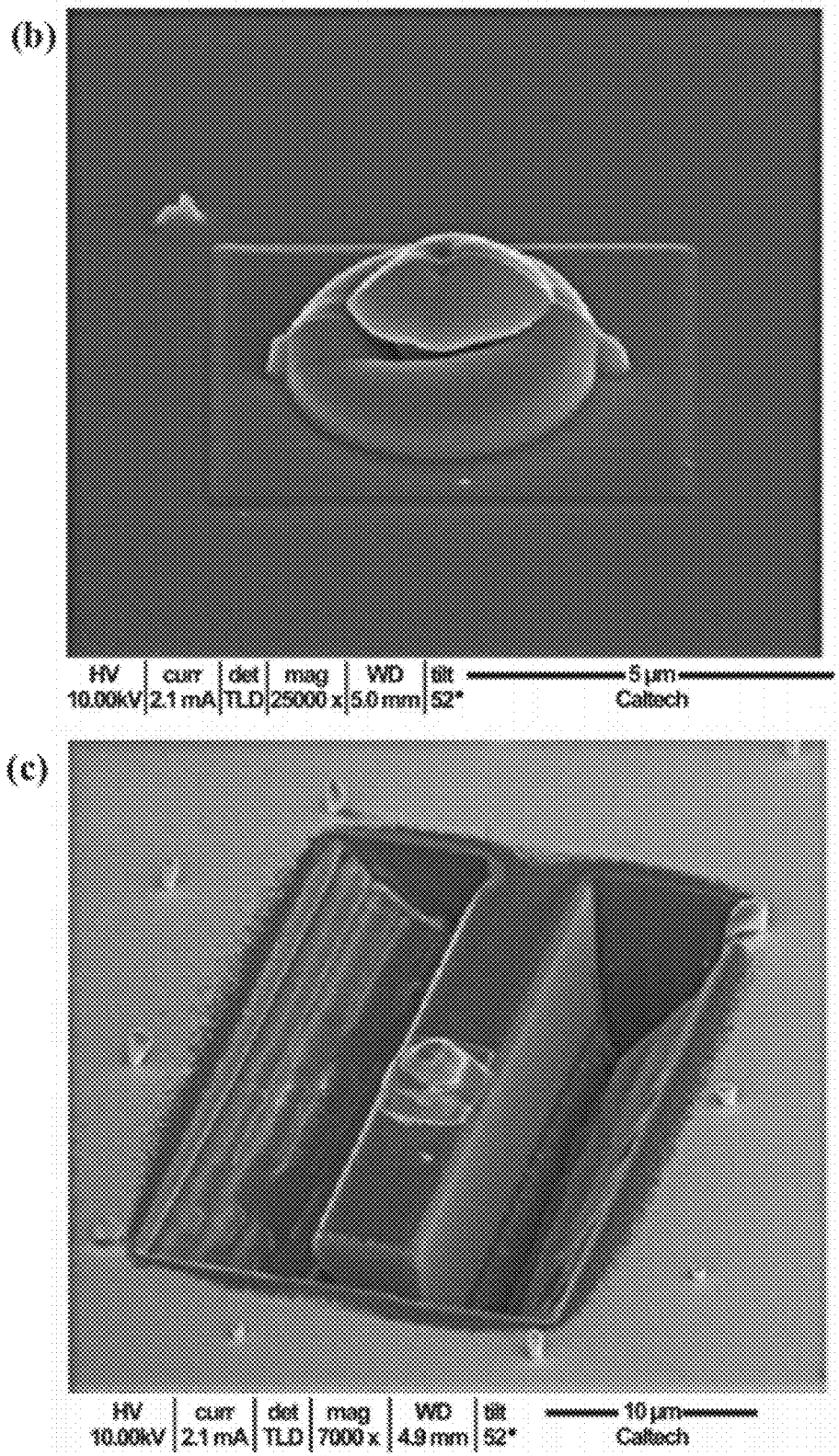
Figure 6:
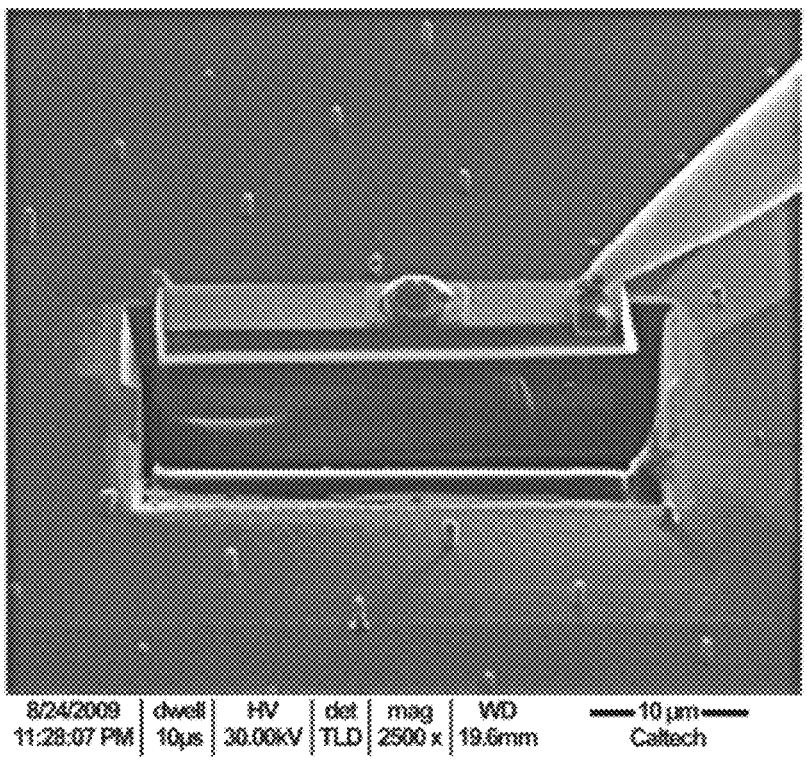
Figure 6:
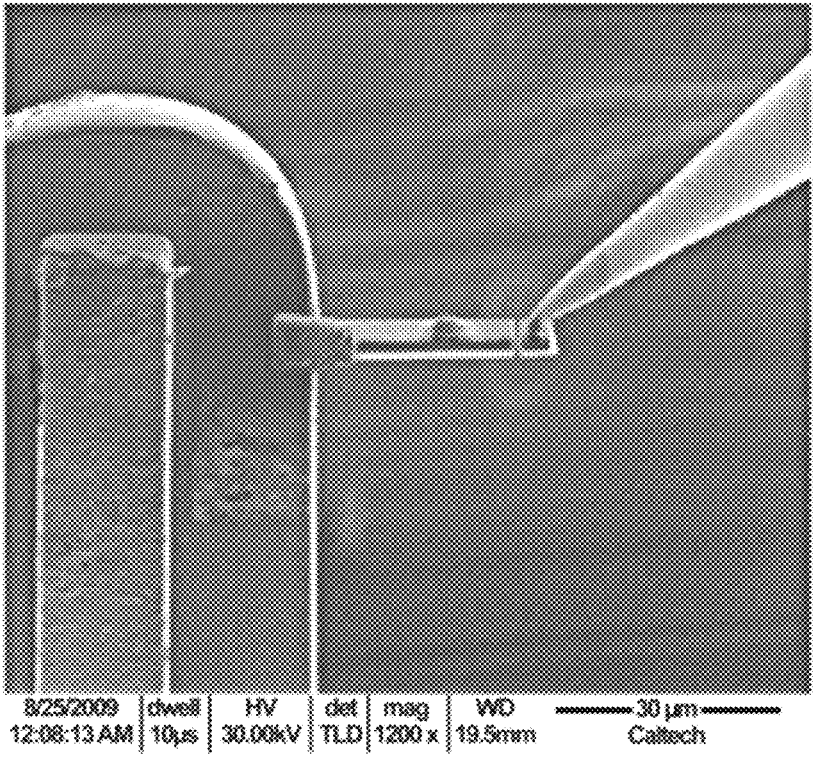
Figure 6:
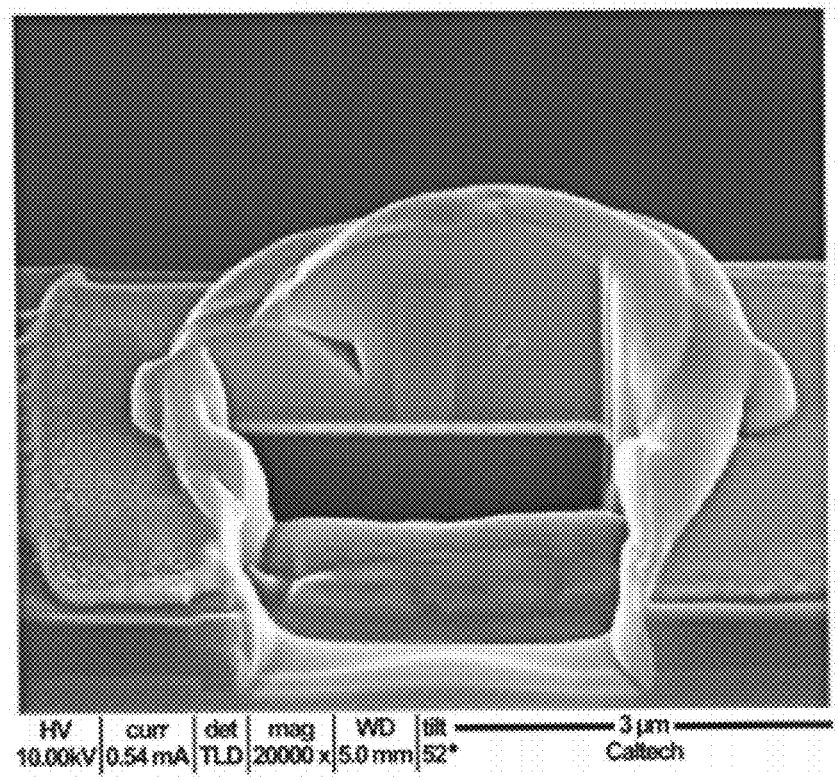
Figure 6:
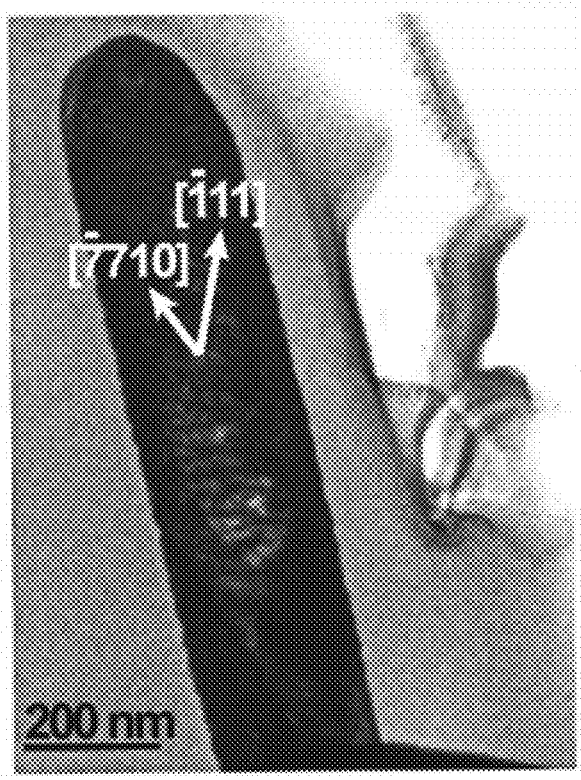
Figure 6:
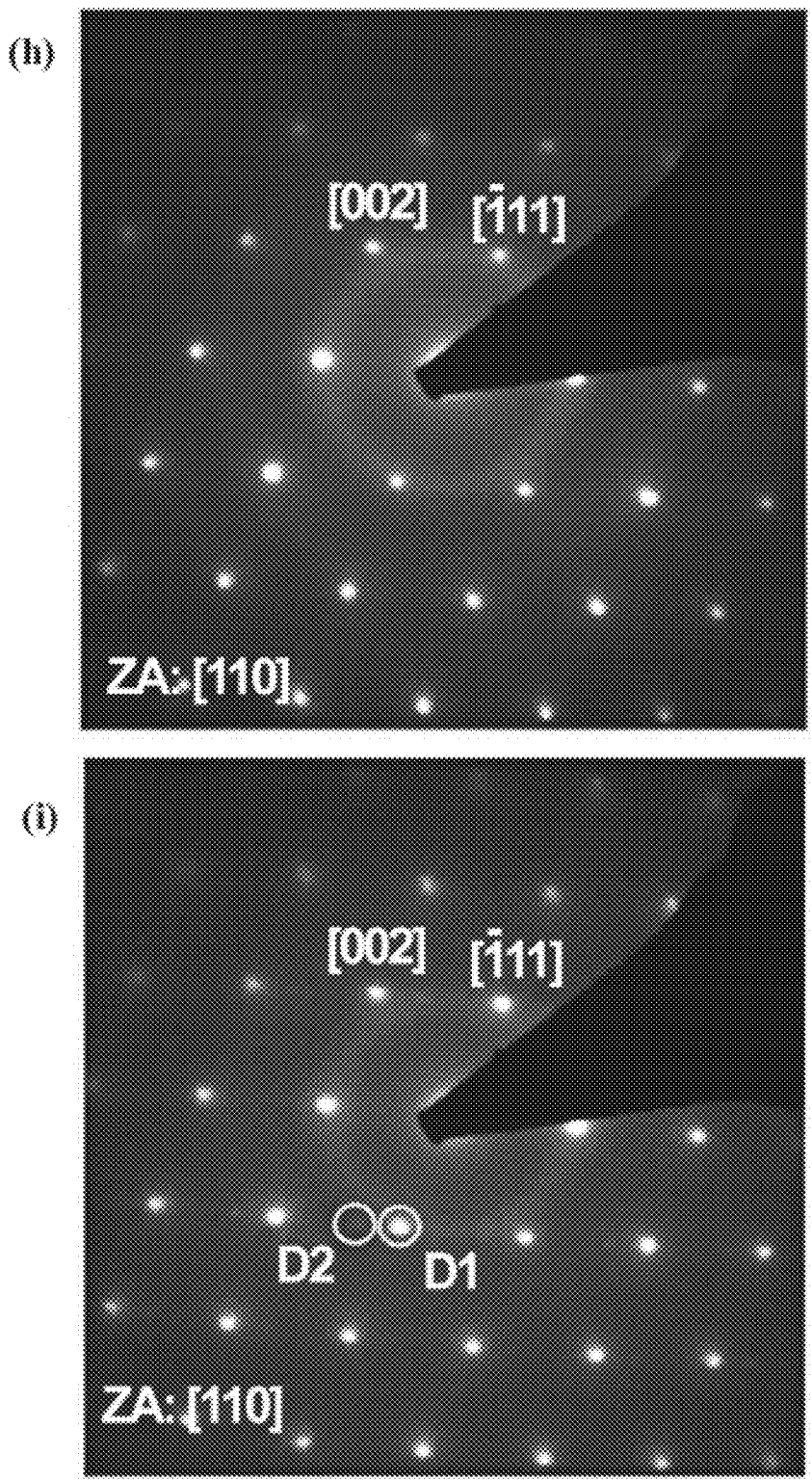
Figure 6:
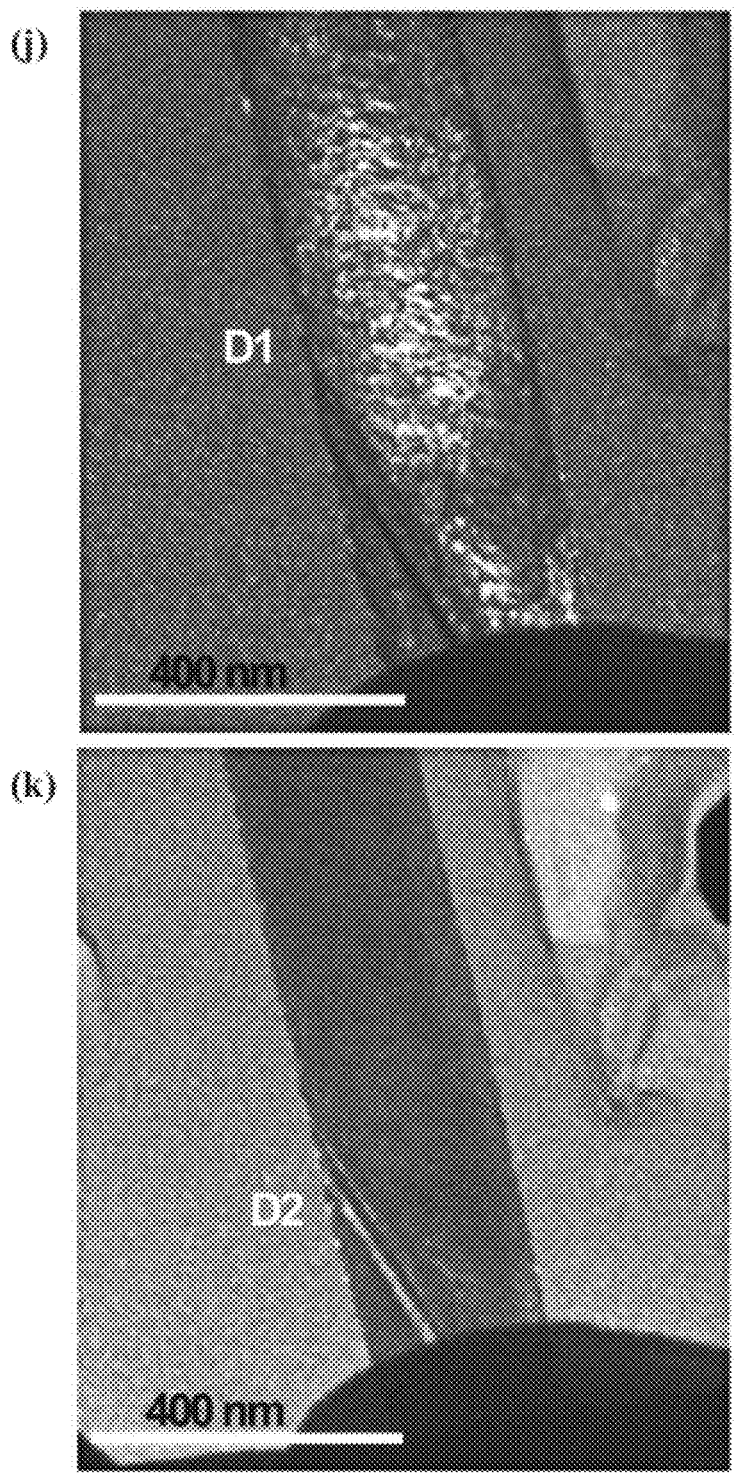

FIG. 4 shows TEM analysis of an ~50 nm diameter Au nanopillar electroplated at 3.5 mA/cm$^2$ DC. The nanopillar was intentionally made overly tall in order to gauge the microstructure through a larger volume. Since the nanopillar was thin enough to be electron transparent, the sacrificial metal masking method was used and the nanopillar was left pristine. The SAED pattern (FIG. 5a, inset) was taken from the entire pillar and shows a clear nanocrystalline structure. Several diffraction spots were used in order to generate dark field images highlighting the corresponding grains (FIG. 5b-d). FIG. 5e is a high resolution TEM image taken at the top left corner of the pillar clearly shows the existence of low angle grain boundaries.

FIG. 6a-f shows representative images outlining the conventional lamella lift-out TEM sample preparation method. FIG. 6g shows a bright field TEM image of a 250 nm diameter Cu nanopillar electroplated with a 10 mA/cm$^2$ forward pulse and 3.5 mA/cm² reverse pulse. The nanopillar was prepared using the conventional Pt coating and FIB thinning technique with the final thickness of ~120 nm. The excessive ion damage is clear, and high resolution imaging was not possible because of it. From the SAED pattern taken from the upper half of the nanopillar (FIG. 6h), the microstructure appears to be single crystalline. The SAED pattern taken from the bottom half of the nanopillars (FIG. 6i) indicates that there is a second small grain in the area immediately adjacent to the substrate. Dark field TEM images (FIG. 6j,k) were generated from the SAED (FIG. 6i) and clearly show the existence of one major grain and one small grain boundary near the bottom of the pillar. The nanopillar axis (and loading axis) was determined to be [7 7 10], ~10° off of [1 1 1].

Although a number of embodiments and features have been described above, it will be understood by those skilled in the art that modifications and variations of the described embodiments and features may be made without departing from the teachings of the disclosure or the scope of the invention as defined by the appended claims.

What is claimed is:

1. A solid or hollow nano-crystalline pillar structure lacking Ga$^+$ ion damage, made by a process comprising
   (a) coating a substrate with a conductive layer;
   (b) coating the conductive layer with a resist polymer;
   (c) using an electron beam lithography technique to pattern a template into the resist polymer;
   (d) electrodepositing a metal into the template; and
   (e) removing the resist; and (f) coating over the substrate having the conductive layer and the metal with a metal oxide, a metal nitride or other organo-metallic materials.

2. The solid or hollow nano-crystalline pillar structure of claim 1, wherein the substrate comprises a material selected from the group consisting of silicon dioxide, fused-silica, quartz, silicon, organic polymers, siloxane polymers, borosilicate glass, fluorocarbon polymers, metal, hardened sapphire, and a ceramic.

3. The solid or hollow nano-crystalline pillar structure of claim 2, wherein the substrate is silicon.

4. The solid or hollow nano-crystalline pillar structure of claim 1, wherein the conductive layer comprises a conductive metal.

5. The solid or hollow nano-crystalline pillar structure of claim 1, wherein the resist polymer comprises polymethylmethacrylate.

6. The solid or hollow nano-crystalline pillar structure of claim 1, wherein the electrode positing is by potentiostatic, galvanostatic or by alternating current/voltage techniques.

7. The solid or hollow nano-crystalline pillar structure of claim 1, wherein the metal is selected from the group consisting of gold, silver, rhodium, copper, chrome, nickel, brass, iridium and alloys of any of the foregoing.

8. A method of making a nanopillar composition lacking Ga$^+$ ion damage comprising:
   (a) coating a substrate with a conductive layer;
   (b) coating the conductive layer with a resist polymer;
   (c) using an electron beam lithography technique to pattern a template into the resist polymer;
   (d) electrodepositing a metal into the template; and
   (e) removing the resist; and (f) coating over the substrate having the conductive layer and the metal with a metal oxide, a metal nitride or other organo-metallic materials.

9. The method of claim 8, wherein the substrate comprises a material selected from the group consisting of silicon dioxide, fused-silica, quartz, silicon, organic polymers, siloxane polymers, borosilicate glass, fluorocarbon polymers, metal, hardened sapphire and a ceramic.

10. The method of claim 9, wherein the substrate is silicon.

11. The method of claim 8, wherein the conductive layer comprises a conductive metal.

12. The method of claim 8, wherein the resist polymer comprises polymethyl methacrylate.

13. The method of claim 8, wherein the electrodepositing is by potentiostatic, galvanostatic or by alternating current/voltage techniques.

14. The method of claim 8, wherein the metal is selected from the group consisting of gold, silver, rhodium, copper, chrome, nickel, brass, iridium and alloys of any of the foregoing.

* * * * *